(12) United States Patent
Tiwari

(10) Patent No.: US 10,839,621 B1
(45) Date of Patent: Nov. 17, 2020

(54) ALTERING A VEHICLE BASED ON DRIVING PATTERN COMPARISON

(71) Applicant: TOYOTA MOTOR ENGINEERING & MANUFACTURING NORTH AMERICA, INC., Erlanger, KY (US)

(72) Inventor: Prashant Tiwari, Mountain View, CA (US)

( * ) Notice: Subject to any disclaimer, the term of this patent is extended or adjusted under 35 U.S.C. 154(b) by 0 days.

(21) Appl. No.: 16/521,574

(22) Filed: Jul. 24, 2019

(51) Int. Cl.
| G07C 5/00 | (2006.01) |
| G06F 30/20 | (2020.01) |
| B60R 25/102 | (2013.01) |
| G07C 5/02 | (2006.01) |
| G05B 17/02 | (2006.01) |

(52) U.S. Cl.
CPC ............ G07C 5/008 (2013.01); B60R 25/102 (2013.01); G05B 17/02 (2013.01); G06F 30/20 (2020.01); G07C 5/02 (2013.01)

(58) Field of Classification Search
CPC ........ G07C 5/008; G07C 5/02; B60R 25/102; G05B 17/02; G06F 30/20
USPC ...................................................... 340/426.1
See application file for complete search history.

(56) References Cited

U.S. PATENT DOCUMENTS

| 8,996,546 B2 | 3/2015 | Headd et al. |
| 9,881,430 B1 | 1/2018 | Shah et al. |
| 10,318,904 B2 * | 6/2019 | Johnson ............ G06Q 10/06315 |
| 2001/0003715 A1 | 6/2001 | Jutzi et al. |
| 2017/0286572 A1 | 10/2017 | Hershey et al. |
| 2018/0017467 A1 * | 1/2018 | Hiruta ................ G05B 23/0254 |
| 2018/0257683 A1 | 9/2018 | Govindappa et al. |
| 2018/0267538 A1 | 9/2018 | Shum et al. |
| 2019/0102494 A1 | 4/2019 | Mars |
| 2019/0176862 A1 * | 6/2019 | Kumar ................ B61L 15/0081 |
| 2019/0266295 A1 * | 8/2019 | Masuda ................. G06Q 10/20 |
| 2019/0287079 A1 * | 9/2019 | Shiraishi ................ G06Q 10/20 |
| 2019/0382003 A1 * | 12/2019 | Jiang ...................... B60W 30/09 |
| 2019/0384870 A1 * | 12/2019 | Shiraishi ................. G06F 30/20 |

OTHER PUBLICATIONS

Alam, Kazi Masudul et al., "C2PS: a digital twin architecture reference model for the cloud-based cyber-physical systems," IEEE access, vol. 5, 2017, pp. 2050-2062.

(Continued)

*Primary Examiner* — John A Tweel, Jr.
(74) *Attorney, Agent, or Firm* — Burbage Law, P.C.; Jon-Michael Burbage; Elizabeth Ruzich

(57) ABSTRACT

The disclosure includes embodiments for detecting an unexpected behavior of an ego vehicle based on driving pattern comparison. In some embodiments, a method includes executing a first simulation using a first digital twin that represents a current condition of the ego vehicle in a real-world to generate a first result. The method includes executing a second simulation using a second digital twin that represents a historical condition of the ego vehicle in the real-world to generate a second result. The method includes comparing the first result to the second result to determine that the ego vehicle in the current condition behaves in the first simulation in an unexpected manner when compared to how the ego vehicle in the historical condition behaves in the second simulation. The method includes causing the ego vehicle to provide a notification in the real-world describing the unexpected manner.

20 Claims, 7 Drawing Sheets

(56) References Cited

OTHER PUBLICATIONS

Vadivelu, Somasundaram, "Sensor data computation in a heavy vehicle environment: An Edge computation approach," 2018, 73 pages.
Alam, Kazi Masudul, "Towards Cloud-based Vehicular Cyber-Physical Systems," Diss. Université d'Ottawa/University of Ottawa, 2017, 159 pages.
Damjanovic-Behrendt, Violeta, "A digital twin-based privacy enhancement mechanism for the automotive industry," 2018 International Conference on Intelligent Systems (IS), IEEE, 2018, 8 pages.
Tao, Fei et al., "Digital twin-driven product design, manufacturing and service with big data," The International Journal of Advanced Manufacturing Technology 94.9-12 (2018), pp. 3563-3576.

* cited by examiner

ALTERING A VEHICLE BASED ON DRIVING PATTERN COMPARISON

BACKGROUND

The specification relates to detecting an unexpected behavior of a vehicle based on driving pattern comparison.

An operating performance of a vehicle may change over time. For example, fuel efficiency (e.g., measured in miles per gallon) of the vehicle may drop over time due to various factors such as a dirty oxygen sensor, dirty fuel injectors, misaligned tires or a defective fuel pump, etc. In another example, a pollution emission of the vehicle may increase if spark plugs of the vehicle get old. In these scenarios, a driver of the vehicle may like to know the change on the operating performance of the vehicle in time and have the vehicle inspected if needed.

SUMMARY

One general aspect of embodiments described herein includes a computer program product including a non-transitory memory of a computing device storing computer-executable code that, when executed by a processor, causes the processor to: generate a first digital twin that represents a current condition of an ego vehicle in a real-world based on current vehicle data of the ego vehicle; generate a second digital twin that represents a historical condition of the ego vehicle in the real-world based on historical vehicle data of the ego vehicle; execute a first simulation using the first digital twin to generate a first result; execute a second simulation using the second digital twin to generate a second result; compare the first result to the second result to determine that the ego vehicle in the current condition behaves in the first simulation in an unexpected manner when compared to how the ego vehicle in the historical condition behaves in the second simulation; and cause the ego vehicle to provide a notification in the real-world describing the unexpected manner. Other embodiments of this aspect include corresponding computer systems, apparatus, and computer programs recorded on one or more computer storage devices, each configured to perform the actions of the methods.

In some embodiments, the computer program product further includes that the ego vehicle in the current condition behaving in the unexpected manner indicates that a black market part is installed in the ego vehicle. In some embodiments, the computer program product further includes that the ego vehicle in the current condition behaving in the unexpected manner indicates that the ego vehicle is stolen. In some embodiments, the computer program product further includes that the current vehicle data and the historical vehicle data are recorded by the ego vehicle and transmitted to the computing device. In some embodiments, the described techniques may include hardware, a method or process, or computer software on a computer-accessible medium.

One general aspect includes a method, including: executing a first simulation using a first digital twin that represents a current condition of an ego vehicle in a real-world to generate a first result; executing a second simulation using a second digital twin that represents a historical condition of the ego vehicle in the real-world to generate a second result; comparing the first result to the second result to determine that the ego vehicle in the current condition behaves in the first simulation in an unexpected manner when compared to how the ego vehicle in the historical condition behaves in the second simulation; and causing the ego vehicle to provide a notification in the real-world describing the unexpected manner. Other embodiments of this aspect include corresponding computer systems, apparatus, and computer programs recorded on one or more computer storage devices, each configured to perform the actions of the methods.

In some embodiments, the method further includes that the ego vehicle in the current condition behaving in the unexpected manner indicates that a black market part is installed in the ego vehicle. In some embodiments, the method further includes that the ego vehicle in the current condition behaving in the unexpected manner indicates that the ego vehicle is stolen. In some embodiments, the method is executed by a cloud server. In some embodiments, the method is executed by an edge sever. In some embodiments, the method is executed by a centralized computing device and the first digital twin and the second digital twin are generated based on sensor data that is recorded by the ego vehicle and transmitted to the centralized computing device. In some embodiments, the method includes that the sensor data is wirelessly transmitted to the centralized computing device. In some embodiments, the method includes that the ego vehicle in the current condition behaving in the unexpected manner indicates that a current operating performance of the ego vehicle in the current condition is lower than a historical operating performance of the ego vehicle in the historical condition. In some embodiments, the described techniques may include hardware, a method or process, or computer software on a computer-accessible medium.

One general aspect includes a system including a computer system including a non-transitory memory storing computer code which, when executed by the computer system, causes the computer system to: execute a first simulation using a first digital twin that represents a current condition of an ego vehicle in a real-world to generate a first result; execute a second simulation using a second digital twin that represents a historical condition of the ego vehicle in the real-world to generate a second result; compare the first result to the second result to determine that the ego vehicle in the current condition behaves in the first simulation in an unexpected manner when compared to how the ego vehicle in the historical condition behaves in the second simulation; and cause the ego vehicle to provide a notification in the real-world describing the unexpected manner. Other embodiments of this aspect include corresponding computer systems, apparatus, and computer programs recorded on one or more computer storage devices, each configured to perform the actions of the methods.

In some embodiments, the system further includes that the ego vehicle in the current condition behaving in the unexpected manner indicates that a black market part is installed in the ego vehicle. In some embodiments, the system further includes that the ego vehicle in the current condition behaving in the unexpected manner indicates that the ego vehicle is stolen. In some embodiments, the computer system is located at a cloud server. In some embodiments, the computer system is located at an edge sever. In some embodiments, the computer system is located at a centralized computing device and the first digital twin and the second digital twin are generated based on sensor data that is recorded by the ego vehicle and transmitted to the centralized computing device. In some embodiments, the system includes that the sensor data is wirelessly transmitted to the centralized computing device. In some embodiments, the system further includes that the ego vehicle in the current condition behaving in the unexpected manner indicates that a current operating performance of the ego vehicle in the current condition is lower than a historical operating performance of the ego vehicle in the historical condition. In some embodiments, the described techniques may include hardware, a method or process, or computer software on a computer-accessible medium.

BRIEF DESCRIPTION OF THE DRAWINGS

The disclosure is illustrated by way of example, and not by way of limitation in the figures of the accompanying drawings in which like reference numerals are used to refer to similar elements.

DETAILED DESCRIPTION

Figure 1:
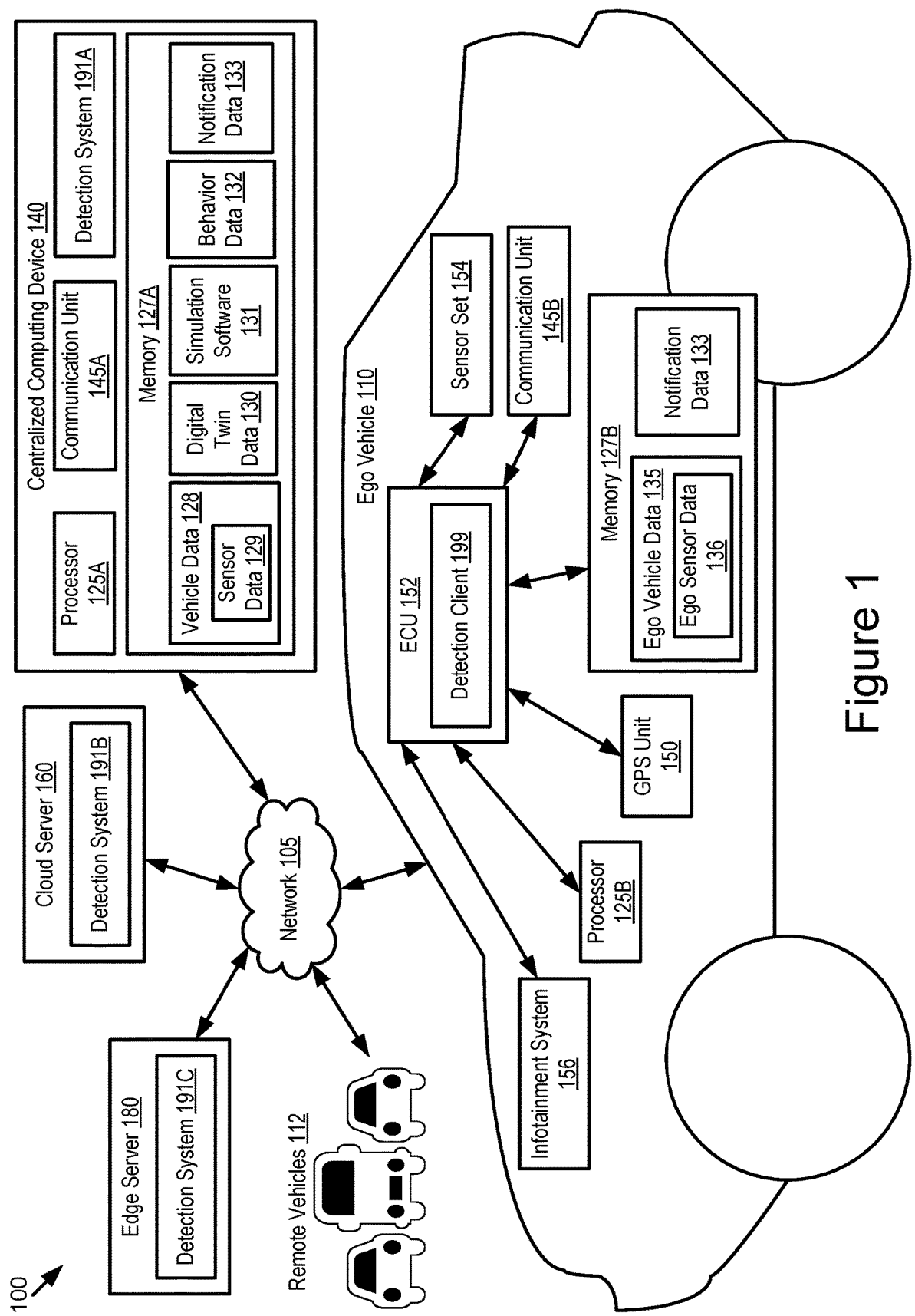
FIG. 1 is a block diagram illustrating an operating environment for a detection system and a detection client according to some embodiments.

In some scenarios, it may be desirable that a behavior (e.g., a driving pattern) of a vehicle can be monitored so that any unexpected behavior of the vehicle can be detected in time and brought to the driver's attention. For example, the driver may like to be informed when an operating performance of the vehicle drops below one or more of (1) an average operating performance of similar vehicles in a same region and (2) a historical operating performance of the vehicle itself. Here, an operating performance of the vehicle may include: a fuel consumption efficiency (e.g., measured in miles per gallon); a performance of an acceleration system; a performance of a brake system; and a performance of any other system of the vehicle, etc.

Described herein are embodiments of (1) a detection system installed in a centralized computing device, a cloud server, an edge server or any other type of server and (2) a detection client installed in the vehicle. The detection system and the detection client may cooperate with one another to detect any unexpected behavior of the vehicle and provide a notification of the unexpected behavior in time. For example, the detection system and the detection client may cooperate with one another to detect whether a current operating performance of the vehicle deviates from its own historical operating performance or an average operating performance of a region. Responsive to a detection of such a deviation, the detection system and the detection client cooperate with one another to provide a notification of the deviation.

Example improvements and advantages provided by the detection client and the detection system described herein are provided here. For example, the detection client installed in the vehicle automatically uploads vehicle data collected by the vehicle to the detection system so that the detection system can detect whether any unexpected behavior occurs to the vehicle. If an unexpected behavior is detected (e.g., a black market part is installed in the vehicle, or the vehicle is stolen, etc.), the detection system generates a notification to notify a driver of the vehicle about the unexpected behavior. The detection system causes the detection client to present the notification on the vehicle so that the driver of the vehicle can learn the unexpected behavior and take a remedial action in time. As a result, a driving experience and a driving safety of the vehicle can be improved.

An example overview of the detection system and the detection client is provided here. Assume that a roadway environment includes: (1) an ego vehicle; and (2) a set of remote vehicles. The ego vehicle and the remote vehicles are of a similar make and model. The ego vehicle and the remote vehicles may drive in similar conditions or geographic locations. This example overview is now described from a perspective of the ego vehicle. The detection client is installed in the ego vehicle (e.g., an electronic control unit (ECU) of the ego vehicle). The detection system is installed in a centralized location (e.g., a centralized computing device, or a cloud server, etc.).

The detection client automatically transfers vehicle data from the ego vehicle to the detection system using a wireless message via any form of Vehicle-to-Everything (V2X) communications. Optionally, edge devices may be used to relay the vehicle data to the detection system. In some embodiments, the detection client transfers the vehicle data to the detection system using a wired communication (e.g., a wired communication at a dealership or at home).

The detection system is operable to execute simulations using digital twins and the vehicle data collected from the ego vehicle (and optionally vehicle data from the remote vehicles) to determine whether the ego vehicle behaves in an unexpected manner. In some embodiments, the unexpected manner is determined by comparing a current behavior of the ego vehicle to a historical behavior of the ego vehicle itself (which is described by expected behavior data). Alternatively or additionally, the unexpected manner is determined by comparing the current behavior of the ego vehicle to a behavior of the remote vehicles that are similar to the ego vehicle (which is also described by the expected behavior data). Accordingly, the expected behavior data is compared to current behavior data of the vehicle to identify an occurrence of an unexpected behavior.

If an unexpected behavior is detected, the detection system may generate a notification that includes a remedial action for the unexpected behavior. The detection system may cause the detection client of the ego vehicle to provide the notification to the driver of the ego vehicle. For example, if the unexpected behavior indicates that an operating performance of the ego vehicle drops significantly when compared to a historical operating performance of the ego vehicle, the remedial action may include taking the ego vehicle to a dealer to be inspected. In some embodiments, the notification provided by the detection system may identify that the ego vehicle is stolen, e.g., because it behaves differently or located in an abnormal geographic location.

As described herein, examples of V2X communications include Dedicated Short Range Communication (DSRC) (including Basic Safety Messages (BSMs) and Personal Safety Messages (PSMs), among other types of DSRC communication). Further examples of V2X communications include: Long-Term Evolution (LTE); millimeter wave (mmWave) communication; 3G; 4G; 5G; LTE-V2X;

5G-V2X; LTE-Vehicle-to-Vehicle (LTE-V2V); LTE-Device-to-Device (LTE-D2D); or Voice over LTE (VoLTE); etc. In some examples, the V2X communications can include V2V communications, Vehicle-to-Infrastructure (V2I) communications, Vehicle-to-Network (V2N) communications or any combination thereof.

Examples of a wireless message (e.g., a V2X message) described herein include, but are not limited to, the following messages: a DSRC message; a BSM message; and a LTE message. Further examples of a wireless message include one or more of the following: a LTE-V2X message (e.g., a LTE-V2V message, a LTE-V2I message, a LTE-V2N message, etc.); a 5G-V2X message; and a millimeter wave message, etc.

Example Overview

Referring to FIG. 1, depicted is an operating environment 100 for a detection client 199 and a detection system 191 according to some embodiments. The operating environment 100 may include one or more of the following elements: an ego vehicle 110; one or more remote vehicles 112; a centralized computing device 140; a cloud server 160; and an edge server 180. These elements of the operating environment 100 may be communicatively coupled to a network 105. In practice, the operating environment 100 may include any number of ego vehicles 110, remote vehicles 112, centralized computing device 140, cloud servers 160, edge servers 180 and networks 105.

The network 105 may be a conventional type, wired or wireless, and may have numerous different configurations including a star configuration, token ring configuration, or other configurations. Furthermore, the network 105 may include a local area network (LAN), a wide area network (WAN) (e.g., the Internet), or other interconnected data paths across which multiple devices and/or entities may communicate. In some embodiments, the network 105 may include a peer-to-peer network. The network 105 may also be coupled to or may include portions of a telecommunications network for sending data in a variety of different communication protocols. In some embodiments, the network 105 includes Bluetooth® communication networks or a cellular communications network for sending and receiving data including via short messaging service (SMS) and multimedia messaging service (MMS). In some embodiments, the network 105 further includes networks for hypertext transfer protocol (HTTP), direct data connection, wireless application protocol (WAP), e-mail, DSRC, full-duplex wireless communication and mmWave. In some embodiments, the network 105 further includes networks for WiFi (infrastructure mode), WiFi (ad-hoc mode), visible light communication, TV white space communication and satellite communication. The network 105 may also include a mobile data network that may include 3G, 4G, LTE, LTE-V2X, LTE-D2D, VoLTE, 5G-V2X or any other mobile data network or combination of mobile data networks. Further, the network 105 may include one or more IEEE 802.11 wireless networks.

The centralized computing device 140 may be a computing device at a centralized location. In some embodiments, the centralized computing device 140 may include one or more of the following elements: a processor 125A; a memory 127A; a communication unit 145A; and an instance of the detection system (e.g., a detection system 191A).

In some embodiments, the processor 125A and the memory 127A may be elements of a computer system (such as computer system 300 described below with reference to FIG. 3). The computer system may be operable to cause or control the operation of the detection system 191A. For example, the computer system may be operable to access and execute the data stored on the memory 127A to provide the functionality described herein for the detection system 191A or its elements (see, e.g., FIG. 3).

The processor 125A includes an arithmetic logic unit, a microprocessor, a general-purpose controller, or some other processor array to perform computations and provide electronic display signals to a display device. The processor 125A processes data signals and may include various computing architectures. Example computing architectures include a complex instruction set computer (CISC) architecture, a reduced instruction set computer (RISC) architecture, or an architecture implementing a combination of instruction sets. The centralized computing device 140 may include one or more processors 125A. Other processors, operating systems, sensors, displays, and physical configurations may be possible.

The memory 127A stores instructions or data that may be executed by the processor 125A. The instructions or data may include code for performing the techniques described herein. The memory 127A may be a dynamic random-access memory (DRAM) device, a static random-access memory (SRAM) device, flash memory, or some other memory device. In some embodiments, the memory 127A also includes a non-volatile memory or similar permanent storage device and media. Example permanent storage devices include a hard disk drive, a floppy disk drive, a CD-ROM device, a DVD-ROM device, a DVD-RAM device, a DVD-RW device, and a flash memory device, etc. Additional example permanent storage devices may include some other mass storage device for storing information on a more permanent basis. The centralized computing device 140 may include one or more memories 127A.

The memory 127A may store one or more of the following elements: vehicle data 128; digital twin data 130; simulation software 131; behavior data 132; and notification data 133.

The vehicle data 128 may include various instances of vehicle data received from various vehicles. For example, the vehicle data 128 may include ego vehicle data 135 received from the ego vehicle 110. The ego vehicle data 135 may include: (1) current vehicle data transmitted to the detection system 191A by the ego vehicle 110 at a current time; and (2) historical vehicle data transmitted to the detection system 191A by the ego vehicle 110 in the past. In another example, the vehicle data 128 may further include remote vehicle data transmitted to the detection system 191A by the remote vehicles 112 (e.g., current vehicle data and historical vehicle data transmitted by the remote vehicles 112).

In some embodiments, vehicle data received from a particular vehicle may include sensor data 129 of that particular vehicle. The sensor data 129 may include digital data describing one or more sensor measurements recorded by that particular vehicle. For example, the vehicle data from the particular vehicle includes one or more of the following: diagnostic information of the vehicle; and vehicle performance and efficiency information of the vehicle. In another example, the vehicle data may also include one or more of the following: information pertaining to "black market" parts placed on the vehicle (if there is any); and digital data indicating whether the vehicle has been reported stolen, etc.

The digital twin data 130 may include digital data describing digital twins generated based on the vehicle data 128. A digital twin can be a simulated version of a specific real-world vehicle that exists in a simulation. A structure, condition, behavior and responses of the digital twin is similar to a structure, condition, behavior and responses of the specific real-world vehicle that the digital twin represents in the simulation. The digital environment included in the simulation may be similar to the real-world operating environment of the real-world vehicle.

The simulation software 131 may include code and routines that are operable to execute simulations based on the digital twins (e.g., digital-twin based simulations).

The behavior data 132 may include current behavior data that describes a current behavior of each vehicle that reports vehicle data to the detection system 191A. The current behavior can be a behavior in either the real world or in simulations executed. In some embodiments, the behavior data 132 may include expected behavior data that describes an expected behavior of the vehicle and other vehicles like it based on simulations.

The notification data 133 may include digital data that describes a notification generated responsive to detecting an occurrence of an unexpected behavior of a vehicle (e.g., the ego vehicle 110). In some embodiments, the notification may also include digital data describing one or more remedial actions to be taken by the vehicle responsive to detecting the unexpected behavior of the vehicle.

The communication unit 145A transmits and receives data to and from the network 105 or to another communication channel. In some embodiments, the communication unit 145A may include a DSRC transceiver, a DSRC receiver and other hardware or software necessary to make the centralized computing device 140 a DSRC-enabled device. For example, the communication unit 145A includes a DSRC antenna configured to broadcast DSRC messages via the network. The DSRC antenna may also transmit BSM messages at a fixed or variable interval (e.g., every 0.1 seconds, at a time interval corresponding to a frequency range from 1.6 Hz to 10 Hz, etc.) that is user configurable.

In some embodiments, the communication unit 145A includes a port for direct physical connection to the network 105 or to another communication channel. For example, the communication unit 145A includes a USB, SD, CAT-5, or similar port for wired communication with the network 105. In some embodiments, the communication unit 145A includes a wireless transceiver for exchanging data with the network 105 or other communication channels using one or more wireless communication methods. Example wireless communication methods may include one or more of the following: IEEE 802.11; and IEEE 802.16, BLUETOOTH®. Example wireless communication methods may further include EN ISO 14906:2004 Electronic Fee Collection—Application interface EN 11253:2004 DSRC—Physical layer using microwave at 5.8 GHz (review). Example wireless communication methods may further include EN 12795:2002 DSRC—DSRC Data link layer: Medium Access and Logical Link Control (review). Example wireless communication methods may further include EN 12834:2002 DSRC—Application layer (review) and EN 13372:2004 DSRC—DSRC profiles for RTTT applications (review). Example wireless communication methods may further include the communication method described in U.S. patent application Ser. No. 14/471,387 filed on Aug. 28, 2014 and entitled "Full-Duplex Coordination System"; or another suitable wireless communication method.

In some embodiments, the communication unit 145A includes a cellular communications transceiver for sending and receiving data over a cellular communications network. For example, the data may be sent or received via short messaging service (SMS), multimedia messaging service (MMS), hypertext transfer protocol (HTTP), direct data connection, WAP, e-mail, or another suitable type of electronic communication. In some embodiments, the communication unit 145A includes a wired port and a wireless transceiver. The communication unit 145A also provides other conventional connections to the network 105 for distribution of files or media objects using standard network protocols including TCP/IP, HTTP, HTTPS, and SMTP, millimeter wave, DSRC, etc.

The communication unit 145A may include a V2X radio. The V2X radio may include a hardware element including a DSRC transmitter which is operable to transmit DSRC messages on the 5.9 GHz band. The 5.9 GHz band is reserved for DSRC messages. The hardware element may also include a DSRC receiver which is operable to receive DSRC messages on the 5.9 GHz band.

The cloud server 160 may be any cloud computing device that includes one or more processors and one or more memories. The cloud server 160 may include an instance of the detection system (e.g., a detection system 191B) and any other appropriate components.

The edge server 180 may be any computing device installed on a roadside that includes one or more processors and one or more memories. The edge server 180 may include an instance of the detection system (e.g., a detection system 191C) and any other appropriate components.

The detection systems 191A, 191B and 191C may have a similar structure and provide similar functionality, and may be referred to herein as "detection system 191" individually or collectively.

In some embodiments, the detection system 191 includes software that is operable to detect any unexpected behavior of a vehicle (e.g., the ego vehicle 110) that reports vehicle data to the detection system 191. In some embodiments, the detection system 191 may be implemented using hardware including a field-programmable gate array ("FPGA") or an application-specific integrated circuit ("ASIC"). In some other embodiments, the detection system 191 may be implemented using a combination of hardware and software. The detection system 191 may be stored in a combination of the devices (e.g., servers or other devices), or in one of the devices.

The detection system 191 is described below in more detail with reference to FIGS. 3 and 5-7.

The ego vehicle 110 may be any type of vehicle. For example, the ego vehicle 110 may include one of the following types of vehicles: a car; a truck; a sports utility vehicle; a bus; a semi-truck; a drone; or any other roadway-based conveyance. The ego vehicle 110 may be a connected vehicle that includes a communication unit and is capable of communicating with other endpoints connected to the network 105.

In some embodiments, the ego vehicle 110 is a DSRC-enabled vehicle which includes a DSRC radio and a DSRC-compliant GPS unit. The ego vehicle 110 may also include other V2X radios besides a DSRC radio. DSRC is not a requirement of embodiments described herein, and any form of V2X communications is also feasible.

The ego vehicle 110 may include one or more of the following elements: a processor 125B; a memory 127B; a communication unit 145B; a GPS unit 150; an ECU 152; a sensor set 154; an infotainment system 156; and a detection client 199. These elements of the ego vehicle 110 may be communicatively coupled to one another via a bus.

The communication unit 145B may have a structure similar to that of the communication unit 145A and provide functionality similar to that of the communication unit 145A. Similar description for the communication unit 145B will not be repeated here.

In some embodiments, the processor 125B and the memory 127B may be elements of an onboard vehicle computer system (such as computer system 200 described below with reference to FIG. 2). The onboard vehicle computer system may be operable to cause or control the operation of the detection client 199. For example, the onboard vehicle computer system may be operable to access and execute the data stored on the memory 127B to provide the functionality described herein for the detection client 199 or its elements (see, e.g., FIG. 2).

The processor 125B may have a structure similar to that of the processor 125A and provide functionality similar to that of the processor 125A. Similar description for the processor 125B will not be repeated here.

The memory 127B may have a structure similar to that of the memory 127A and provide functionality similar to that of the memory 127A. Similar description for the memory 127B will not be repeated here.

The memory 127B may store one or more of the following elements: the ego vehicle data 135; and the notification data 133.

The ego vehicle data 135 may include vehicle data associated with the ego vehicle 110. The ego vehicle data 135 may include ego sensor data 136 that describes one or more sensor measurements recorded by the ego vehicle 110 (e.g., a location, a speed, a heading, a braking pattern, an acceleration pattern, etc., of the vehicle 110). For example, the ego vehicle data 135 includes one or more of the following: diagnostic information of the ego vehicle 110; and vehicle performance and efficiency information of the ego vehicle 110. In another example, the ego vehicle data 135 may also include one or more of the following: information pertaining to "black market" parts placed on the vehicle 110 (if there is any); and digital data indicating whether the ego vehicle 110 has been reported stolen.

The notification data 133 is described above, and so, similar description will not be repeated here.

In some embodiments, the GPS unit 150 is a conventional GPS unit of the ego vehicle 110. For example, the GPS unit 150 may include hardware that wirelessly communicates with a GPS satellite to retrieve data that describes a geographic location of the ego vehicle 110. In some embodiments, the GPS unit 150 is a DSRC-compliant GPS unit of the ego vehicle 110. The DSRC-compliant GPS unit is operable to provide GPS data describing the geographic location of the ego vehicle 110 with lane-level accuracy.

The ECU 152 can include one or more processors and one or more memories. The ECU 152 may control an operation of the infotainment system 156, the sensor set 154 and the detection client 199 of the ego vehicle 110. In some embodiments, the detection client 199 is installed in the ECU 152.

The sensor set 154 includes one or more sensors that are operable to measure a roadway environment outside of the ego vehicle 110. For example, the sensor set 154 may include one or more sensors that record one or more physical characteristics of the roadway environment that is proximate to the ego vehicle 110. The memory 127B may store sensor data that describes the one or more physical characteristics recorded by the sensor set 154.

The sensor set 154 may also include various sensors that record an environment internal to a cabin of the ego vehicle 110. For example, the sensor set 154 includes onboard sensors which monitor the environment of the ego vehicle 110 whether internally or externally. In a further example, the sensor set 154 includes cameras, LIDAR, radars, infrared sensors and sensors that observe the behavior of the driver such as internal cameras, biometric sensors, etc.

In some embodiments, the sensor set 154 may include one or more of the following vehicle sensors: a camera; a LIDAR sensor; a radar sensor; a laser altimeter; an infrared detector; a motion detector; a thermostat; and a sound detector. The sensor set 154 may also include one or more of the following sensors: a carbon monoxide sensor; a carbon dioxide sensor; an oxygen sensor; a mass air flow sensor; and an engine coolant temperature sensor. The sensor set 154 may also include one or more of the following sensors: a throttle position sensor; a crank shaft position sensor; an automobile engine sensor; a valve timer; an air-fuel ratio meter; and a blind spot meter. The sensor set 154 may also include one or more of the following sensors: a curb feeler; a defect detector; a Hall effect sensor, a manifold absolute pressure sensor; a parking sensor; a radar gun; a speedometer; and a speed sensor. The sensor set 154 may also include one or more of the following sensors: a tire-pressure monitoring sensor; a torque sensor; a transmission fluid temperature sensor; and a turbine speed sensor (TSS); a variable reluctance sensor; and a vehicle speed sensor (VSS). The sensor set 154 may also include one or more of the following sensors: a water sensor; a wheel speed sensor; and any other type of automotive sensor.

The infotainment system 156 may provide information to a driver of the ego vehicle 110. For example, the infotainment system 156 may include a touch screen, a speaker, a microphone or any other user interaction device. The infotainment system 156 can be used to present a notification to the driver.

The remote vehicle 112 present on a roadway of the ego vehicle 110 may have a structure similar to that of the ego vehicle 110. Similar description will not be repeated here.

In some embodiments, the detection client 199 includes software that is operable, when executed by the processor 125B, to cause the processor 125B to execute one or more steps of a method 400 described below with reference to FIG. 4. In some embodiments, the detection client 199 may be implemented using hardware including an FPGA or an ASIC. In some other embodiments, the detection client 199 may be implemented using a combination of hardware and software. The detection client 199 may be stored in a combination of the devices (e.g., servers or other devices), or in one of the devices.

The detection client 199 is described below in more detail with reference to FIGS. 2 and 4.

A specific example that illustrates a cooperation process between the detection system 191 installed in the cloud server 160 and the detection client 199 installed in the ego vehicle 110 is provided here. In this example, the detection client 199 of the ego vehicle 110 uploads vehicle data of the ego vehicle 110 to the cloud server 160. The detection system 191 of the cloud server 160 generates a "current digital twin" of the ego vehicle 110 using the most recent vehicle data uploaded to the cloud server 160 by the ego vehicle 110. The detection system 191 executes a series of simulations using the current digital twin. The detection system 191 stores one or more "historical digital twins" of the ego vehicle 110 on the cloud server 160 because the ego vehicle 110 has uploaded other sets of vehicle data to the cloud server 160 in the past. The detection system 191 compares the performance of the current digital twin to the performance of the one or more historical digital twins. Based on this comparison, the detection system 191 determines that the ego vehicle 110 operates differently now relative to its prior behavior (e.g., a significant change in its fuel efficiency, braking patterns or acceleration patterns, etc., is evident in the simulations). The detection system 191 determines that the ego vehicle 110 needs to be inspected. The detection system 191 transmits notification data to the ego vehicle 110 that causes the infotainment system 156 of the ego vehicle 110 to provide a notification to the driver. The notification informs the driver that the ego vehicle 110 needs to be taken to a dealership for maintenance.

Example Computer System

Figure 2:
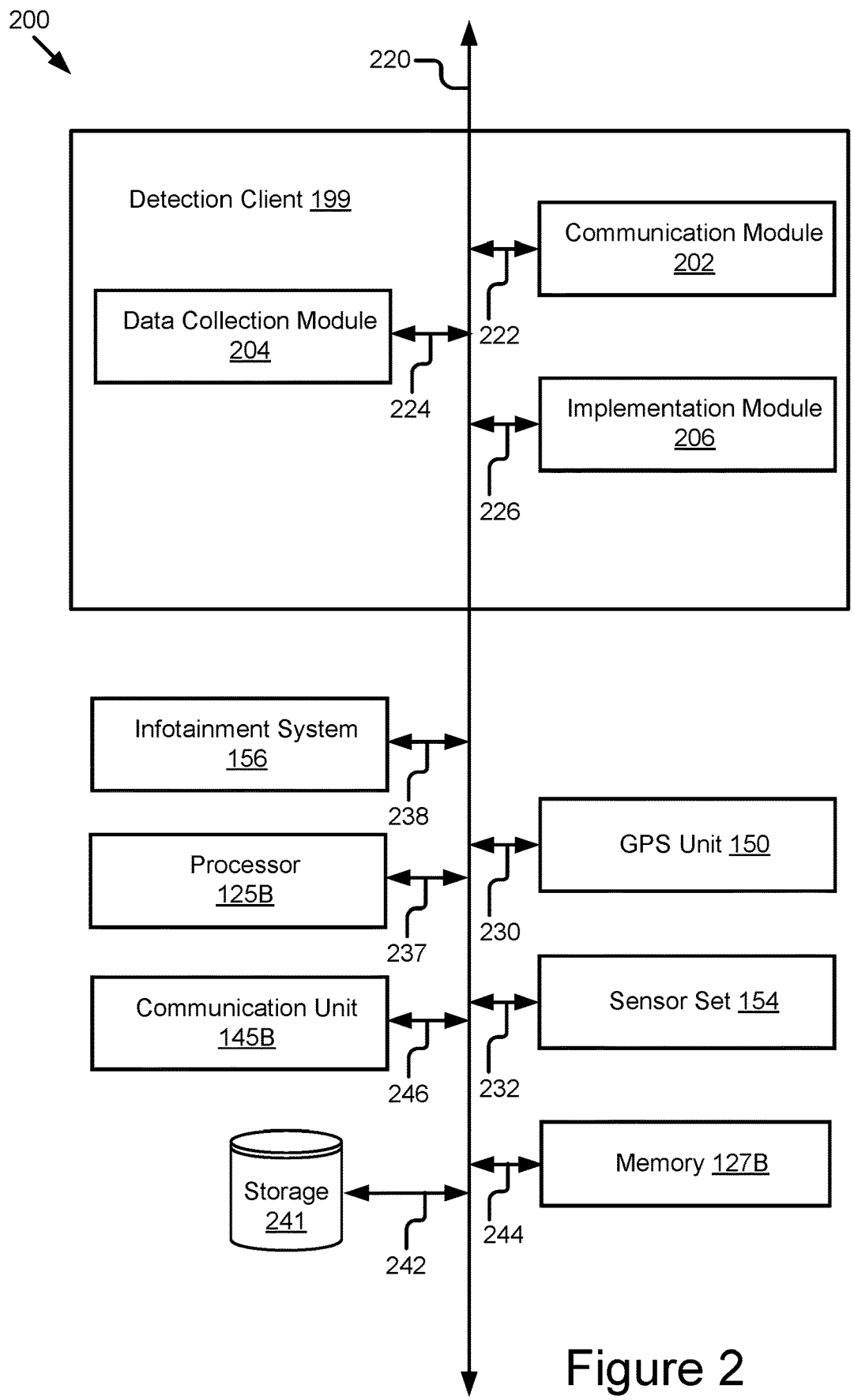
FIG. 2 is a block diagram illustrating an example computer system including the detection client according to some embodiments.

Referring now to FIG. 2, depicted is a block diagram illustrating an example computer system 200 including the detection client 199 according to some embodiments. In some embodiments, the computer system 200 may include a special-purpose computer system that is programmed to perform one or more steps of the method 400 described below with reference to FIG. 4.

In some embodiments, the computer system 200 may be an element of the ego vehicle 110. In some embodiments, the computer system 200 may be an onboard vehicle computer of the ego vehicle 110. In some embodiments, the computer system 200 may include an engine control unit, head unit or some other processor-based computing device of the ego vehicle 110.

The computer system 200 may include one or more of the following elements according to some examples: the detection client 199; the processor 125B; and the communication unit 145B. The computer system 200 may further include one or more of the following elements: the sensor set 154; the GPS unit 150; the memory 127B; the infotainment system 156; and a storage 241. The components of the computer system 200 are communicatively coupled by a bus 220.

In the illustrated embodiment, the processor 125B is communicatively coupled to the bus 220 via a signal line 237. The infotainment system 156 is communicatively coupled to the bus 220 via a signal line 238. The communication unit 145B is communicatively coupled to the bus 220 via a signal line 246. The storage 241 is communicatively coupled to the bus 220 via a signal line 242. The GPS unit 150 is communicatively coupled to the bus 220 via a signal line 230. The sensor set 154 is communicatively coupled to the bus 220 via a signal line 232. The memory 127B is communicatively coupled to the bus 220 via a signal line 244.

The following elements are described above with reference to FIG. 1: the processor 125B; the communication unit 145B; the sensor set 154; the GPS unit 150; the infotainment system 156; and the memory 127B. Those descriptions will not be repeated here.

The storage 241 can be a non-transitory storage medium that stores data for providing the functionality described herein. The storage 241 may be a DRAM device, a SRAM device, flash memory, or some other memory devices. In some embodiments, the storage 241 also includes a non-volatile memory or similar permanent storage device and media (e.g., a hard disk drive, a floppy disk drive, a flash memory device, etc.) for storing information on a more permanent basis.

In the illustrated embodiment shown in FIG. 2, the detection client 199 includes: a communication module 202; a data collection module 204; and an implementation module 206. These components of the detection client 199 are communicatively coupled to each other via the bus 220. In some embodiments, components of the detection client 199 can be stored in a single server or device. In some other embodiments, components of the detection client 199 can be distributed and stored across multiple servers or devices.

The communication module 202 can be software including routines for handling communications between the detection client 199 and other components of the computer system 200. In some embodiments, the communication module 202 can be stored in the memory 127B of the computer system 200 and can be accessible and executable by the processor 125B. The communication module 202 may be adapted for cooperation and communication with the processor 125B and other components of the computer system 200 via a signal line 222.

The communication module 202 sends and receives data, via the communication unit 145B, to and from one or more elements of the operating environment 100. For example, the communication module 202 receives or transmits, via the communication unit 145B, notification data or vehicle data of the ego vehicle 110. The communication module 202 may send or receive any of the data or messages described above with reference to FIG. 1 via the communication unit 145B.

In some embodiments, the communication module 202 receives data from the other components of the detection client 199 and stores the data in one or more of the storage 241 and the memory 127B. The other components of the detection client 199 may cause the communication module 202 to communicate with the other elements of the computer system 200 or the operating environment 100 (via the communication unit 145B). For example, the data collection module 204 may use the communication module 202 to communicate with the sensor set 154 and cause the sensor set 154 to record sensor data.

The data collection module 204 can be software including routines for collecting vehicle data of the ego vehicle 110. In some embodiments, the data collection module 204 can be stored in the memory 127B of the computer system 200 and can be accessible and executable by the processor 125B. The data collection module 204 may be adapted for cooperation and communication with the processor 125B and other components of the computer system 200 via a signal line 224.

In some embodiments, the data collection module 204 receives sensor data from one or more sensors of the ego vehicle 110. For example, the data collection module 204 is operable to cause the sensor set 154 to record sensor data (e.g., current sensor data) that describes one or more sensor measurements of the ego vehicle 110 in real time or near real time. The sensor data includes one or more of the following: (1) location data describing a geographic location of the ego vehicle 110; (2) speed data describing a speed of the ego vehicle 110; and (3) acceleration data describing an acceleration pattern of the ego vehicle 110, etc. The sensor data may also include any other type of sensor data.

In some embodiments, the data collection module 204 generates vehicle data of the ego vehicle 110 based on the sensor data. For example, the vehicle data may include the sensor data. The vehicle data may further include one or more of the following: diagnostic information of the ego vehicle 110; vehicle performance and efficiency information of the ego vehicle 110; and any other information related to the ego vehicle 110. The data collection module 204 transmits the vehicle data of the ego vehicle 110 to the detection system 191 via a wireless V2X message.

The implementation module 206 can be software including routines for implementing one or more instructions received from the detection system 191. In some embodiments, the implementation module 206 can be stored in the memory 127B of the computer system 200 and can be accessible and executable by the processor 125B. The implementation module 206 may be adapted for cooperation and communication with the processor 125B and other components of the computer system 200 via a signal line 226.

In some embodiments, the implementation module 206 receives, from the detection system 191, an instruction indicating to provide a notification to a driver of the ego vehicle 110. The implementation module 206 executes the instruction to cause the infotainment system 156 to present the notification to the driver. For example, the implementation module 206 receives notification data describing the notification from the detection system 191, and causes the infotainment system 156 to present the notification on the ego vehicle 110.

In some embodiments, the implementation module 206 receives an instruction indicating to install software updates on the ego vehicle 110 so that a problem identified by a digital-twin based simulation can be solved by the software updates. In this case, there is no need for the driver to take the ego vehicle 110 to a dealership or mechanic. For example, if the ego vehicle 110 accelerates or decelerates differently, then one or more settings of the vehicle's Advanced Driver Assistance System (ADAS system) or fuel pump may be modified via the software updates to address this change.

Figure 3:
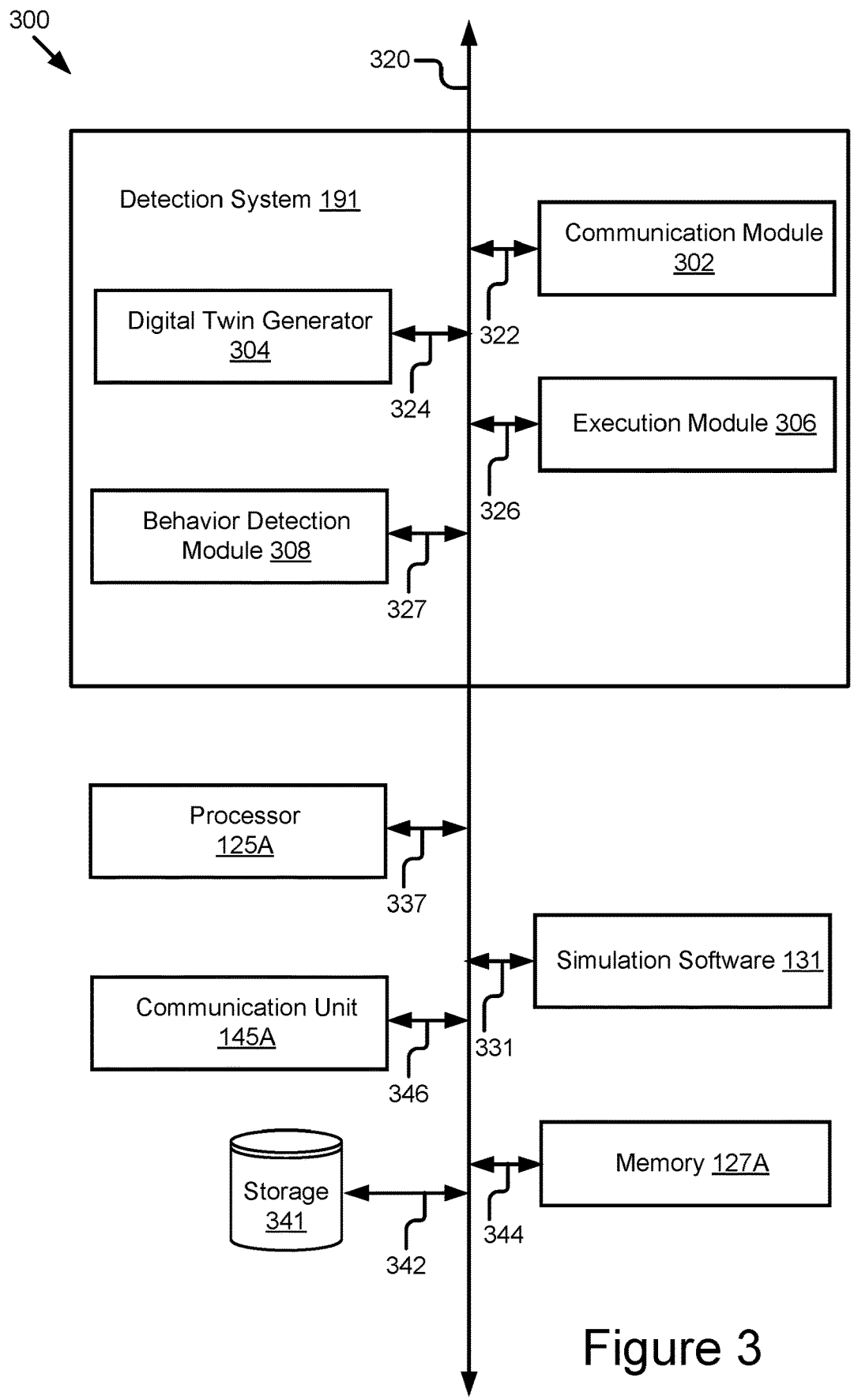
FIG. 3 is a block diagram illustrating an example computer system including the detection system according to some embodiments.

Referring now to FIG. 3, depicted is a block diagram illustrating an example computer system 300 including the detection system 191 according to some embodiments. In some embodiments, the computer system 300 may include a special-purpose computer system that is programmed to perform one or more steps of the methods 500, 600 and 700 described below with reference to FIGS. 5-7.

In some embodiments, the computer system 300 may be an element of the centralized computing device 140, the cloud server 160 or the edge server 180. The computer system 300 may include one or more of the following elements according to some examples: the detection system 191; the processor 125A; and the communication unit 145A. The computer system 300 may further include one or more of the following elements: the memory 127A; the simulation software 131; and a storage 341. The components of the computer system 300 are communicatively coupled by a bus 320.

In the illustrated embodiment, the processor 125A is communicatively coupled to the bus 320 via a signal line 337. The simulation software 131 is communicatively coupled to the bus 320 via a signal line 331. The communication unit 145A is communicatively coupled to the bus 320 via a signal line 346. The storage 341 is communicatively coupled to the bus 320 via a signal line 342. The memory 127A is communicatively coupled to the bus 320 via a signal line 344.

The following elements are described above with reference to FIG. 1: the processor 125A; the communication unit 145A; the simulation software 131; and the memory 127A. Those descriptions will not be repeated here.

The storage 341 may have a structure similar to that of the storage 241 and provide functionality similar to that of the storage 241. Similar description for the storage 341 will not be repeated here.

In the illustrated embodiment shown in FIG. 3, the detection system 191 includes: a communication module 302; a digital twin generator 304; an execution module 306; and a behavior detection module 308. These components of the detection system 191 are communicatively coupled to each other via the bus 320. In some embodiments, components of the detection system 191 can be stored in a single server or device. In some other embodiments, components of the detection system 191 can be distributed and stored across multiple servers or devices.

The communication module 302 can be software including routines for handling communications between the detection system 191 and other components of the computer system 300. In some embodiments, the communication module 302 can be stored in the memory 127A of the computer system 300 and can be accessible and executable by the processor 125A. The communication module 302 may be adapted for cooperation and communication with the processor 125A and other components of the computer system 300 via a signal line 322.

The communication module 302 sends and receives data, via the communication unit 145A, to and from one or more elements of the operating environment 100. For example, the communication module 302 receives or transmits, via the communication unit 145A, vehicle data of the ego vehicle 110 or notification data. The communication module 302 may send or receive any of the data or messages described above with reference to FIG. 1 via the communication unit 145A.

In some embodiments, the communication module 302 receives data from the other components of the detection system 191 and stores the data in one or more of the storage 341 and the memory 127A. The other components of the detection system 191 may cause the communication module 302 to communicate with the other elements of the computer system 300 or the operating environment 100 (via the communication unit 145A).

The digital twin generator 304 can be software including routines for generating digital twins. In some embodiments, the digital twin generator 304 can be stored in the memory 127A of the computer system 300 and can be accessible and executable by the processor 125A. The digital twin generator 304 may be adapted for cooperation and communication with the processor 125A and other components of the computer system 300 via a signal line 324.

In some embodiments, the digital twin generator 304 receives first vehicle data (e.g., current vehicle data) of the ego vehicle 110. The digital twin generator 304 generates a first digital twin that represents a first condition of the ego vehicle 110 in a real-world based on the first vehicle data of the ego vehicle 110. For example, the digital twin generator 304 generates a current digital twin that represents a current condition of the ego vehicle 110 in the real-world based on the current vehicle data of the ego vehicle 110. Here, the first digital twin is the current digital twin of the ego vehicle 110.

In some embodiments, the digital twin generator 304 also receives second vehicle data of a comparable vehicle. The digital twin generator 304 generates a second digital twin that represents a second condition of the comparable vehicle in the real-world based on the second vehicle data. A comparable vehicle can be a vehicle having a similar make and model of the ego vehicle 110 and located in a same region of the ego vehicle 110 so that a first behavior of the ego vehicle 110 can be compared to a second behavior of the comparable vehicle.

For example, the comparable vehicle is also the ego vehicle 110 itself. The second vehicle data represents historical vehicle data of the ego vehicle 110, and the second condition of the comparable vehicle represents a historical condition of the ego vehicle 110. The digital twin generator 304 generates a historical digital twin that represents the historical condition of the ego vehicle 110 in the real-world based on the historical vehicle data. Here, the second digital twin is the historical digital twin of the ego vehicle 110.

In another example, the comparable vehicle is a remote vehicle 112. For example, the remote vehicle 112 represents a vehicle that has an average operating performance in a region where the ego vehicle 110 is located. The second vehicle data represents historical or current vehicle data of the remote vehicle 112, and the second condition of the comparable vehicle represents a historical or current condition of the remote vehicle 112. The digital twin generator 304 generates a remote digital twin that represents the historical or current condition of the remote vehicle 112 in the real-world based on the historical or current vehicle data of the remote vehicle 112. Here, the second digital twin is the remote digital twin of the remote vehicle 112.

In some embodiments, the digital twin generator 304 may generate a set of remote digital twins that represent a set of historical or current conditions of a set of remote vehicles 112 in the real-world based on a set of historical or current vehicle data of the remote vehicles 112. The set of remote vehicles 112 may have a same make and model as the ego vehicle 110. The set of remote vehicles 112 may be present in a same region (e.g., a same city, a same state, or a same country, etc.) as the ego vehicle 110.

The execution module 306 can be software including routines for executing simulations using digital twins. In some embodiments, the execution module 306 can be stored in the memory 127A of the computer system 300 and can be accessible and executable by the processor 125A. The execution module 306 may be adapted for cooperation and communication with the processor 125A and other components of the computer system 300 via a signal line 326.

In some embodiments, based on the simulation software 131, the execution module 306 executes a first simulation using the first digital twin that represents the first condition of the ego vehicle 110 in the real-world to generate a first result. For example, the execution module 306 executes the first simulation using a current digital twin that represents a current condition of the ego vehicle 110 to generate the first result. The first result may describe a current behavior of the ego vehicle 110. For example, the first result describes one or more of the following: a current driving pattern (e.g., an acceleration pattern, a brake pattern, etc.) of the ego vehicle 110; a current location of the ego vehicle 110; and a current operating performance of the ego vehicle 110, etc.

In some embodiments, based on the simulation software 131, the execution module 306 executes a second simulation using the second digital twin that represents the second condition of the comparable vehicle in the real-world to generate a second result. For example, the comparable vehicle is also the ego vehicle 110. The execution module 306 executes the second simulation using a historical digital twin that represents a historical condition of the ego vehicle 110 to generate the second result. The second result may describe a historical behavior of the ego vehicle 110. For example, the second result describes one or more of the following: a historical driving pattern of the ego vehicle 110; a historical location of the ego vehicle 110; and a historical operating performance of the ego vehicle 110, etc.

In another example, the comparable vehicle is a remote vehicle 112. The execution module 306 executes the second simulation using a remote digital twin that represents a current (or historical) condition of the remote vehicle 112. Then, the execution module 306 generates the second result that may describe a current (or historical) behavior of the remote vehicle 112. For example, the second result describes one or more of the following: a current (or historical) driving pattern of the remote vehicle 112; and a current (or historical) operating performance of the remote vehicle 112, etc.

In some embodiments, the execution module 306 executes the second simulation using a set of remote digital twins that represent a set of current (or historical) conditions of a set of remote vehicles 112 that are similar to the ego vehicle 110. Then, the execution module 306 generates the second result that may describe a set of current (or historical) behaviors of the set of remote vehicles 112.

The behavior detection module 308 can be software including routines for detecting any unexpected behavior of the ego vehicle 110. In some embodiments, the behavior detection module 308 can be stored in the memory 127A of the computer system 300 and can be accessible and executable by the processor 125A. The behavior detection module 308 may be adapted for cooperation and communication with the processor 125A and other components of the computer system 300 via a signal line 327.

In some embodiments, the behavior detection module 308 compares the first result of the ego vehicle 110 to the second result of the comparable vehicle to determine whether any unexpected behavior occurs to the ego vehicle 110. The unexpected behavior may indicate that the ego vehicle 110 in the first condition behaves in the first simulation in an unexpected manner when compared to how the comparable vehicle in the second condition behaves in the second simulation.

For example, the unexpected behavior may indicate that a black market part is installed in the ego vehicle 110. In another example, the unexpected behavior may indicate that the ego vehicle 110 appears in an abnormal location, which may be used to infer that the vehicle is likely to be stolen.

In yet another example, the unexpected behavior may indicate that a current operating performance of the ego vehicle 110 drops significantly when compared to a historical operating performance of the ego vehicle 110. In still yet another example, the unexpected behavior indicates that the current operating performance of the ego vehicle 110 is lower than a current or historical operating performance of a remote vehicle 112. The current or historical operating performance of the remote vehicle 112 represents an average operating performance in the region. In still yet another example, the unexpected behavior indicates that the current operating performance of the ego vehicle 110 is lower than an average of a set of current (or historical) operating performances of a set of remote vehicles 112 in the region.

In still yet another example, the unexpected behavior indicates that a difference between a current pollution emission and a historical pollution emission of the ego vehicle 110 is greater than a threshold. In still yet another example, the unexpected behavior indicates that the current pollution emission of the ego vehicle 110 is greater than an average pollution emission of other vehicles in the region. Other examples of the unexpected behavior are possible.

In some examples, the comparable vehicle is also the ego vehicle 110. The behavior detection module 308 compares the first result to the second result. The behavior detection module 308 determines that the ego vehicle 110 in the current condition behaves in the first simulation in an unexpected manner when compared to how the ego vehicle 110 in the historical condition behaves in the second simulation.

Specifically, the behavior detection module 308 compares the current behavior of the ego vehicle 110 to the historical behavior of the ego vehicle 110. Then, the behavior detection module 308 determines that an unexpected behavior occurs to the ego vehicle 110 if a deviation between the current and historical behaviors of the ego vehicle 110 is greater than a deviation threshold. For example, if a current operating performance of the ego vehicle 110 drops significantly when compared to a historical operating performance of the ego vehicle 110, the behavior detection module 308 determines that an unexpected behavior occurs to the ego vehicle 110. That is, the unexpected manner of the ego vehicle 110 indicates that the current operating performance of the ego vehicle 110 is much lower than the historical operating performance of the ego vehicle 110.

In some examples, the comparable vehicle is a remote vehicle 112. The remote vehicle 112 represents, for example, a vehicle that has an average operating performance in a region where the ego vehicle 110 is located. The behavior detection module 308 compares the first result to the second result. The behavior detection module 308 determines that the ego vehicle 110 in its current condition behaves in the first simulation in an unexpected manner when compared to how the remote vehicle 112 in the second condition behaves in the second simulation.

Specifically, the behavior detection module 308 compares the current behavior of the ego vehicle 110 to a current or historical behavior of the remote vehicle 112. Assume that a deviation between the current behavior of the ego vehicle 110 and the current or historical behavior of the remote vehicle 112 is greater than a deviation threshold. Then, the behavior detection module 308 determines that an unexpected behavior occurs to the ego vehicle 110. For example, if a current operating performance of the ego vehicle 110 is lower than a current or historical operating performance of the remote vehicle 112, the behavior detection module 308 determines that an unexpected behavior occurs to the ego vehicle 110. That is, the unexpected manner of the ego vehicle 110 indicates that the current operating performance of the ego vehicle 110 is lower than the average operating performance in the region.

In some examples, the second result may describe a set of current (or historical) behaviors of a set of remote vehicles 112. The behavior detection module 308 compares the first result to the second result to determine that an unexpected behavior occurs to the ego vehicle 110. Specifically, the behavior detection module 308 compares the current behavior of the ego vehicle 110 to the set of current (or historical) behaviors of the remote vehicles 112 to determine that an unexpected behavior occurs to the ego vehicle 110. For example, assume that a current operating performance of the ego vehicle 110 is lower than an average of a set of current (or historical) operating performances of the remote vehicles 112. Then, the behavior detection module 308 determines that an unexpected behavior occurs to the ego vehicle 110.

In some embodiments, responsive to determining that an unexpected behavior occurs to the ego vehicle 110, the behavior detection module 308 generates a notification describing the unexpected behavior. For example, the notification describes how the ego vehicle 110 in the current condition behaves in the unexpected manner. The notification may also include one or more remedial actions to be taken by the ego vehicle 110. The behavior detection module 308 transmits the notification to the ego vehicle 110 to cause the ego vehicle 110 to provide the notification in the real-world. For example, the behavior detection module 308 generates an instruction indicating to provide the notification on the ego vehicle 110 and sends the instruction to the ego vehicle 110.

In some embodiments, the behavior detection module 308 identifies a problem of the ego vehicle 110 through the first simulation and the second simulation (e.g., simulations based on the current and historical digital twins of the ego vehicle 110). For example, the behavior detection module 308 identifies that the ego vehicle 110 accelerates or decelerates differently from its past driving pattern. The behavior detection module 308 may provide software updates that can solve the problem and generates an instruction indicating to install the software updates on the ego vehicle 110. The behavior detection module 308 may send the instruction to the ego vehicle 110, which may cause one or more settings of the vehicle's ADAS system or fuel pump to be modified by the software updates to address this problem. In this case, there is no need for the driver to take the ego vehicle 110 to a dealership or mechanic.

From the above description for FIG. 3, it can be seen that a combination of digital twins is used in the digital-twin based simulations. For example, (1) a current digital twin of the ego vehicle 110 in its current condition at the present time and (2) a historical digital twin of the ego vehicle 110 in a historical condition at an earlier time are used in the simulations. In another example, (1) the current digital twin of the ego vehicle 110 in its current condition and (2) one or more remote digital twins of one or more remote vehicles of a similar make and model of the ego vehicle 110 are used in the simulations. The one or more remote digital twins represents current conditions, or historical conditions, of the one or more remote vehicles 112 at the present time, or an earlier time.

Furthermore, through simulations using the combination of digital twins, the detection system 191 determines whether the ego vehicle 110 behaves in an unexpected manner relative to a historical behavior of the ego vehicle 110 or a behavior of the one or more remote vehicles 112. For example, the detection system 191 runs the simulations using (1) the current digital twin of the ego vehicle 110 and (2) the one or more remote digital twins of the one or more remote vehicles 112. In another example, the detection system 191 runs the simulations using (1) the current digital twin of the ego vehicle 110 and (2) the historical digital twin of the ego vehicle 110. Then, the detection system 191 determines whether the ego vehicle 110 in the current condition behaves in an unexpected manner based on the simulation results.

By the use of current and historical digital twins of the ego vehicle 110, it can be determined whether the ego vehicle 110 is stolen or has had black market parts installed. For example, if the current behavior of the ego vehicle 110 deviates from a historical behavior of the ego vehicle 110 significantly (e.g., a significant change in acceleration and braking profiles), it can be determined that the vehicle is likely to be stolen. In another example, if a current location of the ego vehicle 110 deviates from historical locations of the ego vehicle 110 significantly (e.g., the vehicle has never left California for years and suddenly appears in Alabama), it can be determined that the vehicle is likely to be stolen.

If the ego vehicle 110 is an electric vehicle or a plug-in hybrid vehicle, the detection system 191 can be installed in a computing device of the ego vehicle's own charging station. In this case, the simulations can be executed by this computing device using the current digital twin and the historical digital twin of the ego vehicle 110.

Example Processes

Figure 4:
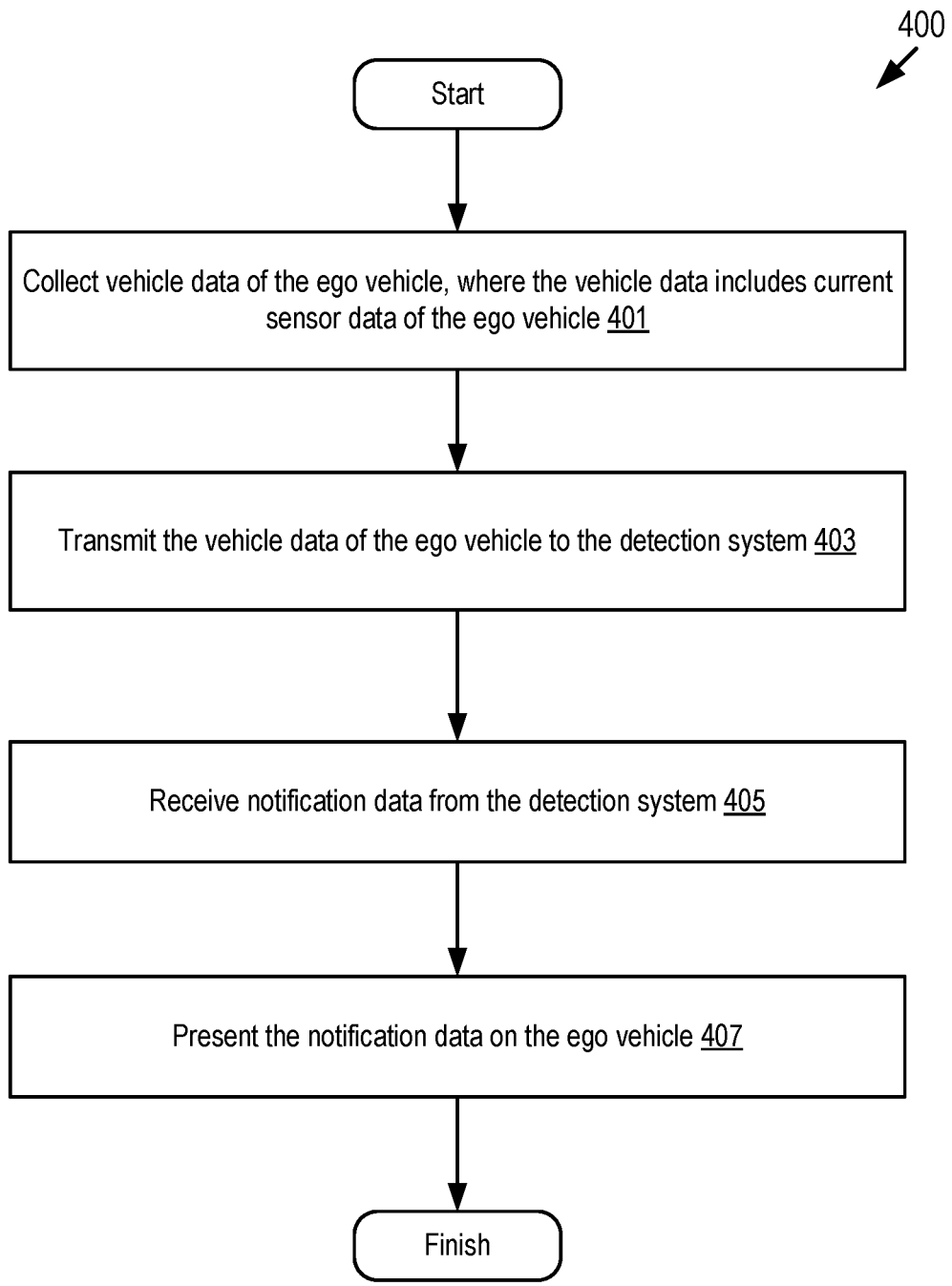
FIG. 4 depicts a method for providing a notification of an unexpected behavior on a vehicle according to some embodiments.

Referring now to FIG. 4, depicted is a flowchart of an example method 400 for providing a notification of an unexpected behavior on a vehicle according to some embodiments. The steps of the method 400 are executable in any order, and not necessarily the order depicted in FIG. 4.

The method 400 may be executed by the detection client 199 installed in the vehicle. The vehicle can be the ego vehicle 110.

At step 401, the data collection module 204 collects vehicle data of the ego vehicle 110, where the vehicle data includes current sensor data of the ego vehicle 110.

At step 403, the data collection module 204 transmits the vehicle data of the ego vehicle 110 to the detection system 191 via the communication unit 145B of the ego vehicle 110.

At step 405, the implementation module 206 receives notification data from the detection system 191.

At step 407, the implementation module 206 presents the notification data on the ego vehicle 110 using the infotainment system 156.

Figure 5:
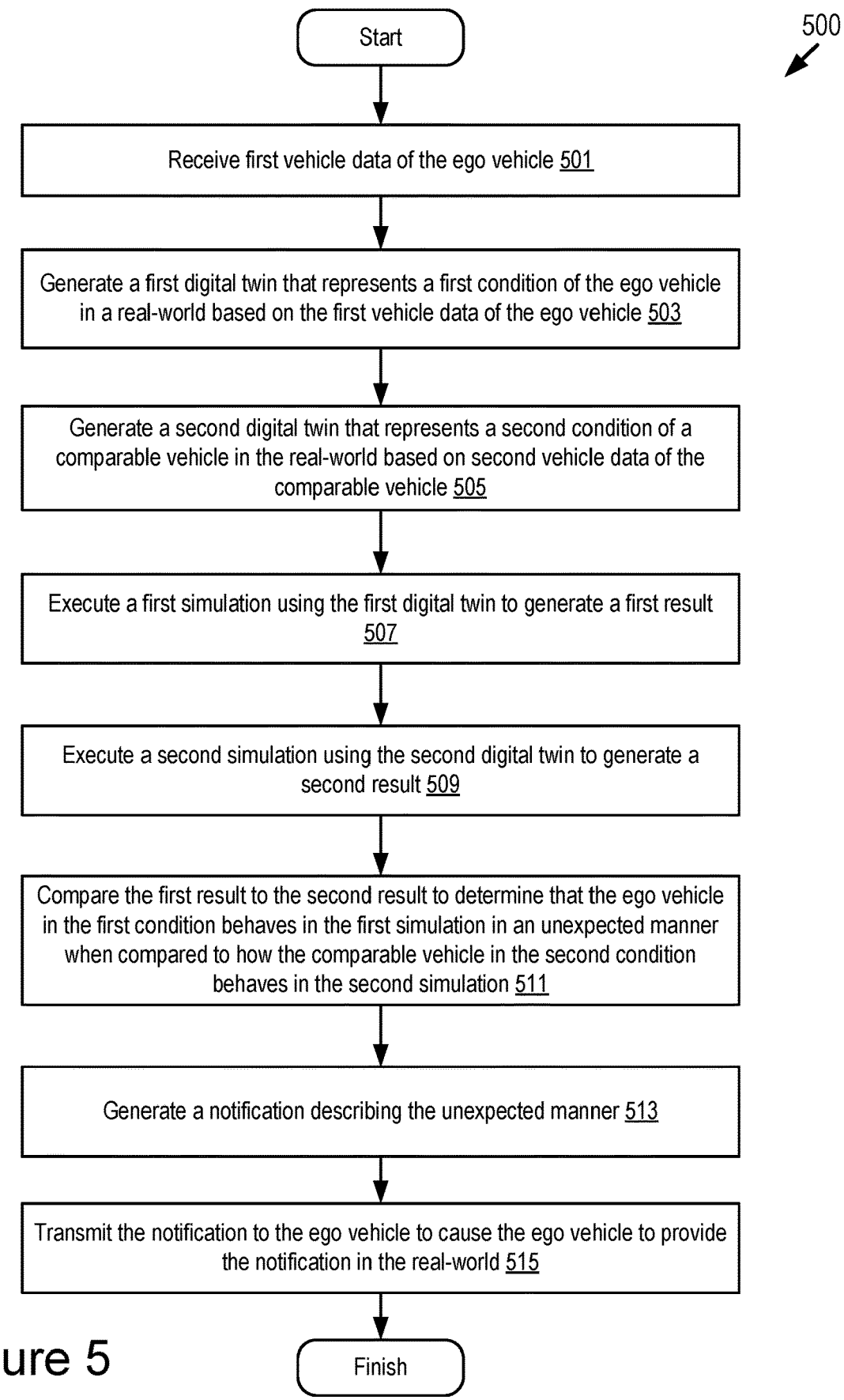
FIG. 5 depicts a method for detecting an unexpected behavior of a vehicle based on driving pattern comparison according to some embodiments.

FIG. 5 depicts a method 500 for detecting an unexpected behavior of a vehicle based on driving pattern comparison according to some embodiments. The steps of the method 500 are executable in any order, and not necessarily the order depicted in FIG. 5. The method 500 may be executed by the detection system 191 installed in the cloud server 160, the edge server 180 or the centralized computing device 140.

At step 501, the digital twin generator 304 receives first vehicle data of the ego vehicle 110.

At step 503, the digital twin generator 304 generates a first digital twin that represents a first condition of the ego vehicle 110 in a real-world based on the first vehicle data of the ego vehicle 110.

At step 505, the digital twin generator 304 generates a second digital twin that represents a second condition of a comparable vehicle in the real-world based on second vehicle data of the comparable vehicle. For example, the comparable vehicle can also be the ego vehicle 110 (see, e.g., FIGS. 6-7) or a remote vehicle 112.

At step 507, the execution module 306 executes a first simulation using the first digital twin to generate a first result.

At step 509, the execution module 306 executes a second simulation using the second digital twin to generate a second result.

At step 511, the behavior detection module 308 compares the first result to the second result. The behavior detection module 308 determines that the ego vehicle 110 in the first condition behaves in the first simulation in an unexpected manner when compared to how the comparable vehicle in the second condition behaves in the second simulation.

At step 513, the behavior detection module 308 generates a notification describing the unexpected manner.

At step 515, the behavior detection module 308 transmits the notification to the ego vehicle 110 to cause the ego vehicle 110 to provide the notification in the real-world.

Figure 6:
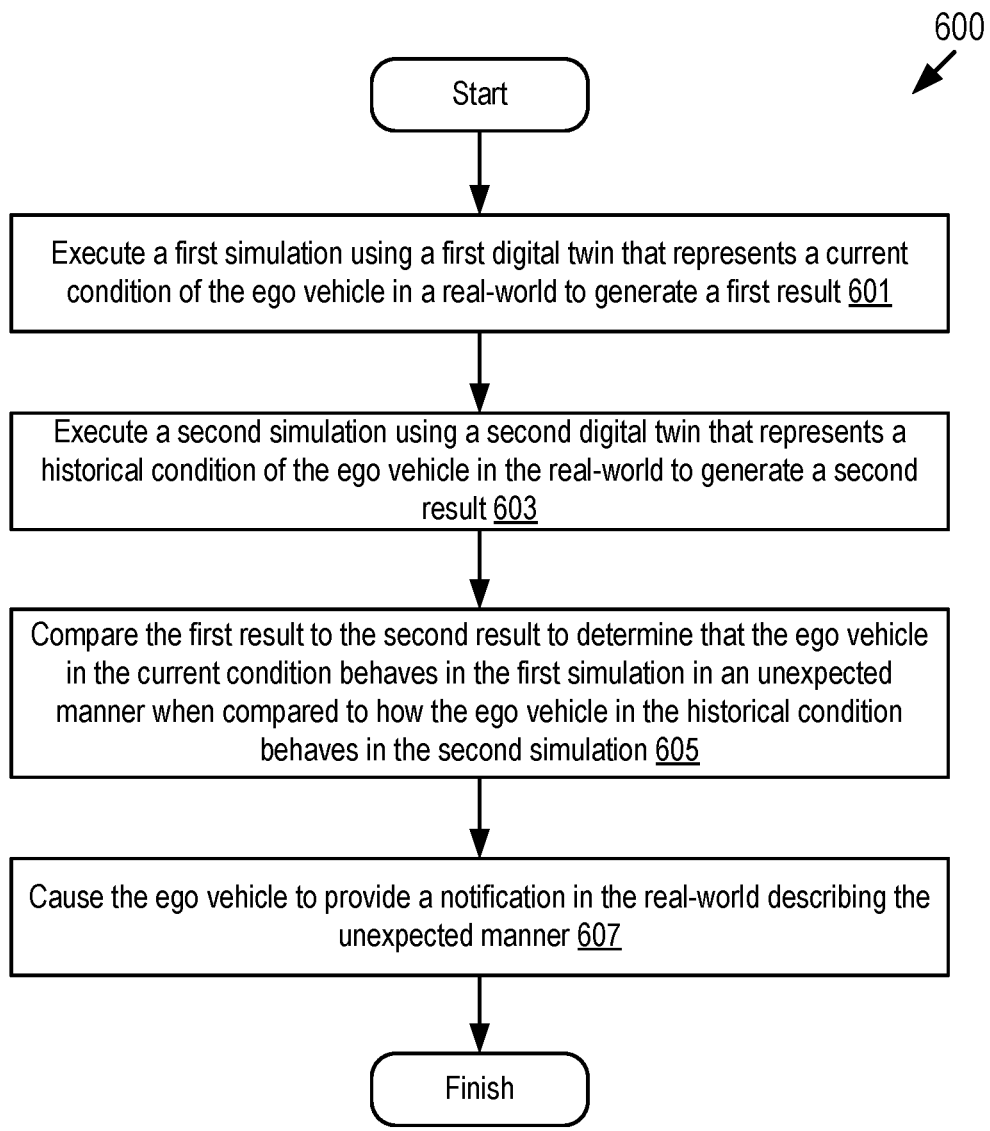
FIG. 6 depicts another method for detecting an unexpected behavior of a vehicle based on driving pattern comparison according to some embodiments.

FIG. 6 depicts another method 600 for detecting an unexpected behavior of a vehicle based on driving pattern comparison according to some embodiments. The steps of the method 600 are executable in any order, and not necessarily the order depicted in FIG. 6. The method 600 may be executed by the detection system 191 installed in the cloud server 160, the edge server 180 or the centralized computing device 140.

At step 601, the execution module 306 executes a first simulation using a first digital twin that represents a current condition of the ego vehicle 110 in a real-world to generate a first result.

At step 603, the execution module 306 executes a second simulation using a second digital twin that represents a historical condition of the ego vehicle 110 in the real-world to generate a second result.

In some embodiments, the first digital twin and the second digital twin are generated based on sensor data that is recorded by the ego vehicle 110 and transmitted to the detection system 191. For example, the sensor data is wirelessly transmitted to the detection system 191 installed in the centralized computing device 140, the cloud server 160 or the edge server 180.

At step 605, the behavior detection module 308 compares the first result to the second result. The behavior detection module 308 determines that the ego vehicle 110 in the current condition behaves in the first simulation in an unexpected manner when compared to how the ego vehicle 110 in the historical condition behaves in the second simulation.

For example, the unexpected manner indicates that a black market part is installed in the ego vehicle 110. In another example, the unexpected manner indicates that the ego vehicle 110 is stolen. In yet another example, the unexpected manner indicates that a current operating performance of the ego vehicle 110 in the current condition is lower than a historical operating performance of the ego vehicle 110 in the historical condition.

At step 607, the behavior detection module 308 causes the ego vehicle 110 to provide a notification in the real-world describing the unexpected manner.

Figure 7:
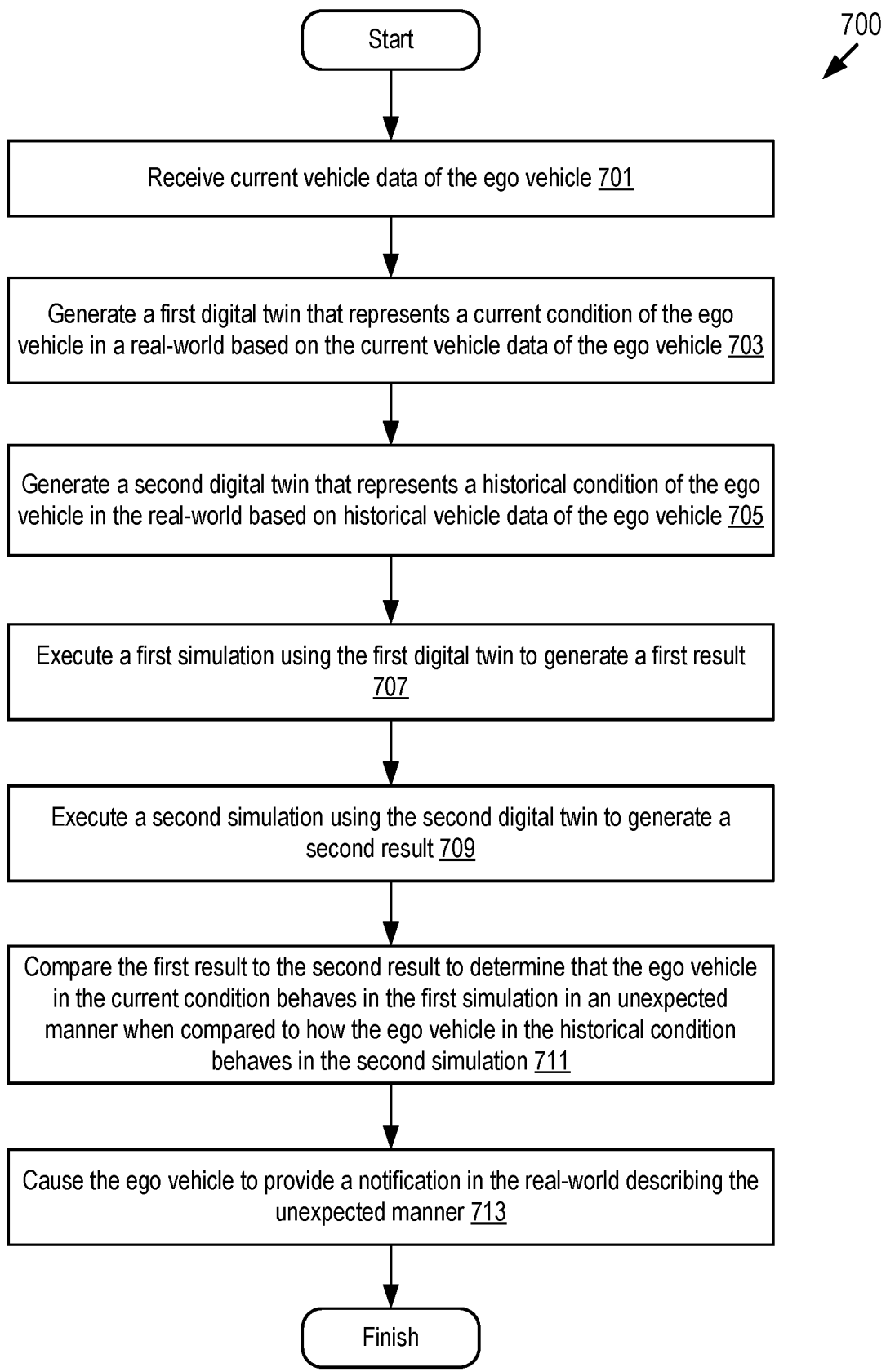
FIG. 7 depicts yet another method for detecting an unexpected behavior of a vehicle based on driving pattern comparison according to some embodiments.

FIG. 7 depicts yet another method 700 for detecting an unexpected behavior of a vehicle based on driving pattern comparison according to some embodiments. The steps of the method 700 are executable in any order, and not necessarily the order depicted in FIG. 7. The method 700 may be executed by the detection system 191 installed in the cloud server 160, the edge server 180 or the centralized computing device 140.

At step 701, the digital twin generator 304 receives current vehicle data of the ego vehicle 110.

At step 703, the digital twin generator 304 generates a first digital twin that represents a current condition of the ego vehicle 110 in a real-world based on the current vehicle data of the ego vehicle 110.

At step 705, the digital twin generator 304 generates a second digital twin that represents a historical condition of the ego vehicle 110 in the real-world based on historical vehicle data of the ego vehicle 110.

At step 707, the execution module 306 executes a first simulation using the first digital twin to generate a first result.

At step 709, the execution module 306 executes a second simulation using the second digital twin to generate a second result.

At step 711, the behavior detection module 308 compares the first result to the second result. The behavior detection module 308 determines that the ego vehicle 110 in the current condition behaves in the first simulation in an unexpected manner when compared to how the ego vehicle 110 in the historical condition behaves in the second simulation.

At step 713, the behavior detection module 308 causes the ego vehicle 110 to provide a notification in the real-world describing the unexpected manner.

In the above description, for purposes of explanation, numerous specific details are set forth in order to provide a thorough understanding of the specification. It will be apparent, however, to one skilled in the art that the disclosure can be practiced without these specific details. In some instances, structures and devices are shown in block diagram form in order to avoid obscuring the description. For example, the present embodiments can be described above primarily with reference to user interfaces and particular hardware. However, the present embodiments can apply to any type of computer system that can receive data and commands, and any peripheral devices providing services.

Reference in the specification to "some embodiments" or "some instances" means that a particular feature, structure, or characteristic described in connection with the embodiments or instances can be included in at least one embodiment of the description. The appearances of the phrase "in some embodiments" in various places in the specification are not necessarily all referring to the same embodiments.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms including "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present embodiments of the specification can also relate to an apparatus for performing the operations herein. This apparatus may be specially constructed for the required purposes, or it may include a general-purpose computer selectively activated or reconfigured by a computer program stored in the computer. Such a computer program may be stored in a computer-readable storage medium, including, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory, or any type of media suitable for storing electronic instructions, each coupled to a computer system bus.

The specification can take the form of some entirely hardware embodiments, some entirely software embodiments or some embodiments containing both hardware and software elements. In some preferred embodiments, the specification is implemented in software, which includes, but is not limited to, firmware, resident software, microcode, etc.

Furthermore, the description can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A data processing system suitable for storing or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including, but not limited, to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem, and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the specification is not described with reference to any particular programming language. It will be appreciated that a variety of programming languages may be used to implement the teachings of the specification as described herein.

The foregoing description of the embodiments of the specification has been presented for the purposes of illustration and description. It is not intended to be exhaustive or to limit the specification to the precise form disclosed. Many modifications and variations are possible in light of the above teaching. It is intended that the scope of the disclosure be limited not by this detailed description, but rather by the claims of this application. As will be understood by those familiar with the art, the specification may be embodied in other specific forms without departing from the spirit or essential characteristics thereof. Likewise, the particular naming and division of the modules, routines, features, attributes, methodologies, and other aspects are not mandatory or significant, and the mechanisms that implement the specification or its features may have different names, divisions, or formats. Furthermore, as will be apparent to one of ordinary skill in the relevant art, the modules, routines, features, attributes, methodologies, and other aspects of the disclosure can be implemented as software, hardware, firmware, or any combination of the three. Also, wherever a component, an example of which is a module, of the specification is implemented as software, the component can be implemented as a standalone program, as part of a larger program, as a plurality of separate programs, as a statically or dynamically linked library, as a kernel-loadable module, as a device driver, or in every and any other way known now or in the future to those of ordinary skill in the art of computer programming. Additionally, the disclosure is in no way limited to embodiment in any specific programming language, or for any specific operating system or environment. Accordingly, the disclosure is intended to be illustrative, but not limiting, of the scope of the specification, which is set forth in the following claims.

What is claimed is:

1. A computer program product comprising a non-transitory memory of a computing device storing computer-executable code that, when executed by a processor, causes the processor to:
generate a first digital twin that represents a current condition of an ego vehicle in a real-world based on current vehicle data of the ego vehicle;
generate a second digital twin that represents a historical condition of the ego vehicle in the real-world based on historical vehicle data of the ego vehicle;
execute a first simulation using the first digital twin to generate a first result;
execute a second simulation using the second digital twin to generate a second result;
compare the first result to the second result to determine that the ego vehicle in the current condition behaves in the first simulation in an unexpected manner when compared to how the ego vehicle in the historical condition behaves in the second simulation; and
cause the ego vehicle to provide a notification in the real-world describing the unexpected manner.

2. The computer program product of claim 1, wherein the unexpected manner indicates that a black market part is installed in the ego vehicle.

3. The computer program product of claim 1, wherein the unexpected manner indicates that the ego vehicle is stolen.

4. The computer program product of claim 1, wherein the current vehicle data and the historical vehicle data are recorded by the ego vehicle and transmitted to the computing device.

5. A method comprising:
executing a first simulation using a first digital twin that represents a current condition of an ego vehicle in a real-world to generate a first result;
executing a second simulation using a second digital twin that represents a historical condition of the ego vehicle in the real-world to generate a second result;
comparing the first result to the second result to determine that the ego vehicle in the current condition behaves in the first simulation in an unexpected manner when compared to how the ego vehicle in the historical condition behaves in the second simulation; and
causing the ego vehicle to provide a notification in the real-world describing the unexpected manner.

6. The method of claim 5, wherein the unexpected manner indicates that a black market part is installed in the ego vehicle.

7. The method of claim 5, wherein the unexpected manner indicates that the ego vehicle is stolen.

8. The method of claim 5, wherein the method is executed by a cloud server.

9. The method of claim 5, wherein the method is executed by an edge sever.

10. The method of claim 5, wherein the method is executed by a centralized computing device and the first digital twin and the second digital twin are generated based on sensor data that is recorded by the ego vehicle and transmitted to the centralized computing device.

11. The method of claim 10, wherein the sensor data is wirelessly transmitted to the centralized computing device.

12. The method of claim 5, wherein the unexpected manner indicates that a current operating performance of the ego vehicle in the current condition is lower than a historical operating performance of the ego vehicle in the historical condition.

13. A system comprising:
a computer system including a non-transitory memory storing computer code which, when executed by the computer system, causes the computer system to:
execute a first simulation using a first digital twin that represents a current condition of an ego vehicle in a real-world to generate a first result;
execute a second simulation using a second digital twin that represents a historical condition of the ego vehicle in the real-world to generate a second result;
compare the first result to the second result to determine that the ego vehicle in the current condition behaves in the first simulation in an unexpected manner when compared to how the ego vehicle in the historical condition behaves in the second simulation; and
cause the ego vehicle to provide a notification in the real-world describing the unexpected manner.

14. The system of claim 13, wherein the unexpected manner indicates that a black market part is installed in the ego vehicle.

15. The system of claim 13, wherein the unexpected manner indicates that the ego vehicle is stolen.

16. The system of claim 13, wherein the computer system is located at a cloud server.

17. The system of claim 13, wherein the computer system is located at an edge sever.

18. The system of claim 13, wherein the computer system is located at a centralized computing device and the first digital twin and the second digital twin are generated based on sensor data that is recorded by the ego vehicle and transmitted to the centralized computing device.

19. The system of claim 18, wherein the sensor data is wirelessly transmitted to the centralized computing device.

20. The system of claim 13, wherein the unexpected manner indicates that a current operating performance of the ego vehicle in the current condition is lower than a historical operating performance of the ego vehicle in the historical condition.

* * * * *